United States Patent
Teixido Rovira et al.

(10) Patent No.: US 9,982,680 B2
(45) Date of Patent: May 29, 2018

(54) FAN OPERATION DETECTION

(71) Applicant: Hewlett-Packard Development Company, L.P., Houston, TX (US)

(72) Inventors: Pedro Miguel Teixido Rovira, Sant Cugat del Valles (ES); Santiago Sanz Ananos, Sant Cugart del Valles (ES); Fernando Bayona Alcolea, Terrassa (ES)

(73) Assignee: Hewlett-Packard Development Company, L.P., Houston, TX (US)

( * ) Notice: Subject to any disclaimer, the term of this patent is extended or adjusted under 35 U.S.C. 154(b) by 117 days.

(21) Appl. No.: 15/029,934

(22) PCT Filed: Oct. 23, 2013

(86) PCT No.: PCT/US2013/066382
§ 371 (c)(1),
(2) Date: Apr. 15, 2016

(87) PCT Pub. No.: WO2015/060841
PCT Pub. Date: Apr. 30, 2015

(65) Prior Publication Data
US 2016/0258437 A1    Sep. 8, 2016

(51) Int. Cl.
*G01P 3/56* (2006.01)
*F04D 27/00* (2006.01)
(Continued)

(52) U.S. Cl.
CPC ......... *F04D 27/001* (2013.01); *F04D 29/582* (2013.01); *G01R 17/00* (2013.01); *G01R 31/045* (2013.01)

(58) Field of Classification Search
CPC ....... H01L 2924/00014; H01L 2924/00; H01L 2224/16225; H01L 2924/181;
(Continued)

(56) References Cited

U.S. PATENT DOCUMENTS 4,804,902 A * 2/1989 Maier ..................... H02P 27/02
318/798
4,977,375 A * 12/1990 Toth ....................... G01R 19/15
324/510
(Continued)

FOREIGN PATENT DOCUMENTS

CN        201771740        3/2011
JP        2009-251356      10/2009
(Continued)

OTHER PUBLICATIONS

PCT Search Report/Written Opinion—Application No. PCT/US2013/066382 dated Jul. 17, 2014~11 pages.
(Continued)

*Primary Examiner* — Jermele M Hollington
*Assistant Examiner* — Taqi Nasir
(74) *Attorney, Agent, or Firm* — Brooks, Cameron & Huebsch, PLLC

(57) ABSTRACT

Inputting an input resistance to an operational amplifier. Detecting whether a number of fans are in operation based on the input resistance to the operational amplifier by driving a number of resistors connected in series in a fan circuit associated with the number of fans.

21 Claims, 3 Drawing Sheets

(51) Int. Cl.
*F04D 29/58* (2006.01)
*G01R 17/00* (2006.01)
*G01R 31/04* (2006.01)

(58) Field of Classification Search
CPC .... H01L 2224/451; H01L 2224/05599; G01R 31/025; G01R 31/34; G01R 31/362; G01R 31/3651; G01R 31/3679; G01R 31/2829; G01R 31/3606
USPC ....... 324/427, 139, 511, 765.01, 544; 327/5, 327/45, 335, 100
See application file for complete search history.

(56) References Cited

U.S. PATENT DOCUMENTS

| | | | | |
|---|---|---|---|---|
| 5,729,989 | A * | 3/1998 | Sunaga | B60H 1/00785 165/204 |
| 5,731,671 | A * | 3/1998 | Adam | G01P 3/48 318/400.13 |
| 2002/0075615 | A1* | 6/2002 | Miermans | G06F 1/206 361/78 |
| 2008/0004755 | A1* | 1/2008 | Dunstan | G06F 1/20 700/299 |
| 2008/0074275 | A1 | 3/2008 | Lin et al. | |
| 2011/0221373 | A1 | 9/2011 | Tong et al. | |
| 2012/0092061 | A1* | 4/2012 | Hsieh | G06F 1/206 327/509 |
| 2012/0223698 | A1* | 9/2012 | Wang | G01P 3/58 324/161 |

FOREIGN PATENT DOCUMENTS

| | | | |
|---|---|---|---|
| JP | 2009251356 A * | 10/2009 | ............ G03G 21/00 |
| JP | 2010206903 | 9/2010 | |
| KR | 20020041621 | 6/2002 | |
| WO | WO-2011006411 | 1/2011 | |

OTHER PUBLICATIONS

Shafer, T., "Methods for Monitoring Fan Performance", Retrieve from http://www.comairrotron.com/methods-monitoring-fan-performance, 2008, 5 pages.

* cited by examiner

FAN OPERATION DETECTION

BACKGROUND

A variety of systems can include fans and heating elements. For such systems, it can be useful to insure the fans are in operation. If a fan is not in operation, heat can accumulate and create a fire risk. Individual fault wires can be used for each fan in a system. As a new fan is added to the system, an additional fault wire could be added. Using individual fault wires for each fan in a system can increase the number of wires used, the size of the wire bundle, and the size of the connectors.

DETAILED DESCRIPTION

Detecting whether a fan is in operation can avoid overheating of the computing components the fan is designed to cool. Some systems may use a number of fans to cool different portions of the system. The fans can be connected in parallel. Determining whether each fan is in operation and/or disconnected can be useful to prevent overheating of any of the computing components the fans are intended to cool, the overall computing system, etc. However, detecting whether each of the fans in series are running and/or disconnected can be difficult.

One approach can include connecting a detector (e.g., a fan fault circuit) in series with the fans. The detector can determine whether all of the fans in series are connected (e.g., with a Vfault read of Vcc) or whether one or more fans have stopped (e.g., with a Vfault read of Vmin). However, the logic state of a fan rotating and a fan disconnected can be the same, making it difficult to diagnose which state the fan is in. Diagnosing whether a fan connector is unplugged or whether one fan of a chain of fans is disconnected can be problematic. In addition, it can be problematic to diagnose whether a single disconnected wire signal is a ground, voltage supply, or fault signal.

A fan in the system can be a critical component to the operation of the system. If determining whether each fan is rotating is important, an individual fault wire for each corresponding fan connected in series can be used. However, the scalability of such a system becomes more difficult with an increasing number of fans. In such a system, the wires and connectors can grow in size and the number of wires can increase. Routing wires for each individual fan can also be difficult.

In contrast, examples in accordance with the presence disclosure can include adding a fan fault circuit including a resistor in series with the transistor of the fan and a fan fault driver in a printed circuit assembly (PCA) to allow for fans to be connected in series while detecting the state of each individual fan without an individual fault wire for each fan. Adding a fan fault circuit and fan fault driver can allow for easier scalability. The number of wires used in such a system can be reduced and each connector (e.g., wire, bundle of wires, etc.) can be smaller. Adding fans into such a setup may not require additional individual fault signals to determine whether a number of fans are operating in the system. Diagnosing an error in fan operation can be simplified and can detect situations including a cable disconnection, a single fan disconnection, and/or a single wire disconnection.

Figure 1:
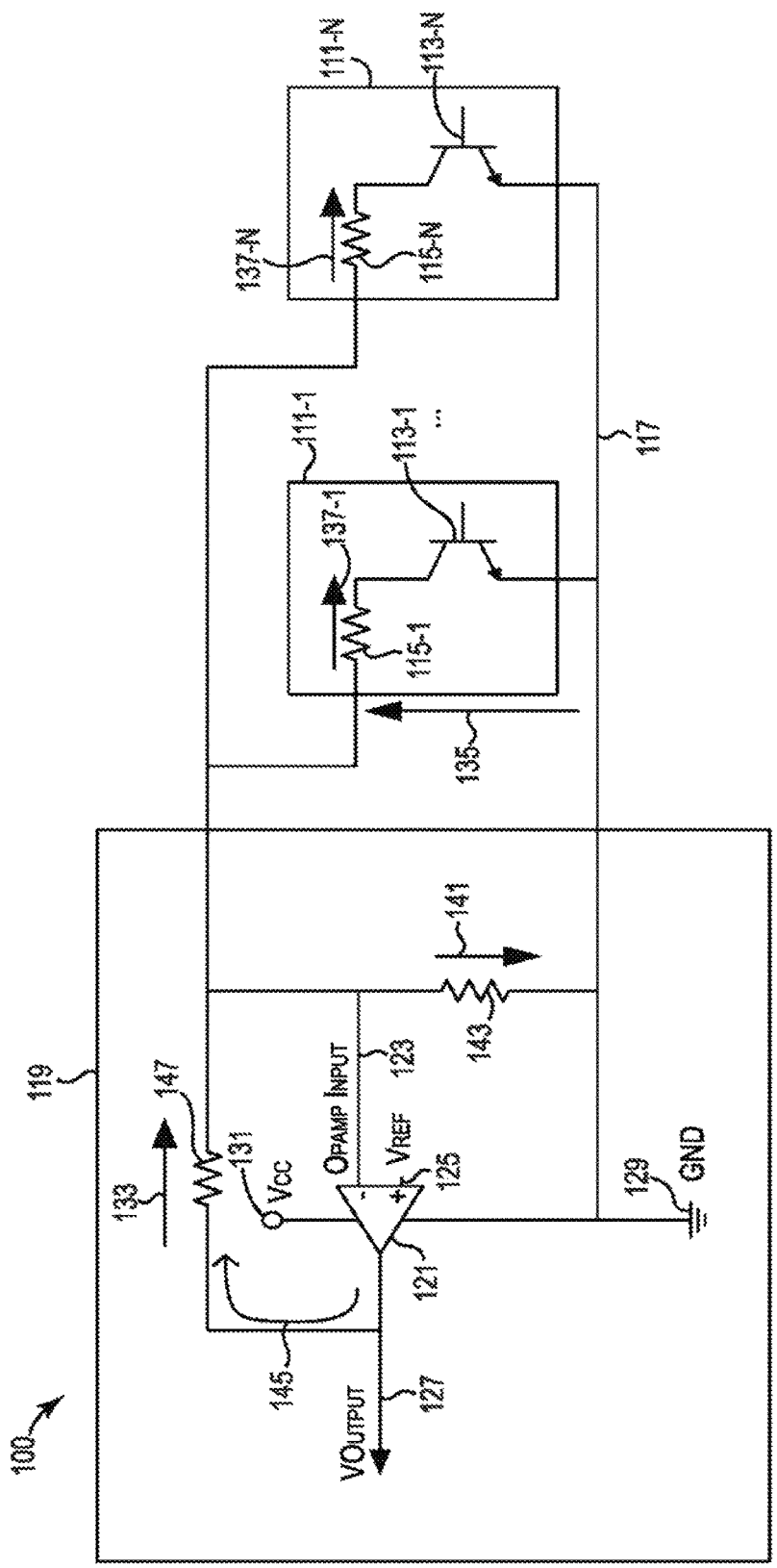
FIG. 1 illustrates an example of a system for fan operation detection according to the present disclosure.

FIG. 1 illustrates an example of a system 100 for fan operation detection according to the present disclosure. The system 100 can include a number of fan circuits 111-1, . . . , 111-N (e.g., fan fault circuits connected to fans). A fan can include a device used to cool (e.g., lower the temperature of) a component of a computing system. A fan can include a number of rotating fins but is not limited to such an embodiment. A fan circuit can include a circuit of a fan used to diagnostically determine if the fan is in operation. The fan circuit can provide a power source to a fan. The number of fan circuits 111-1, . . . , 111-N can include transistors 113-1, . . . 113-N (e.g., open collector transistors). A transistor can include a semiconductor device used to amplify and/or switch electronic signals and electrical power. A transistor can be composed of semiconductor material. A voltage or current can be applied to a pair of the transistor's terminals to change a current through a pair of the terminals. A transistor can be embedded on an integrated circuit (IC).

An open collector can be a type of output of an IC. The output signal can be applied to a number of bases. For example, the output signal can be applied to an internal NPN transistor (the NPN stands for consisting of a layer of P-doped semiconductor between two layers of N-doped material) whose collector/drain is externalized on a pin of the IC, a PNP transistor (one layer of N-doped material between two layers of P-doped material), an N-Channel MOSFET, and/or a P-Channel MOSFET, among others.

The fan circuits 111-1, . . . , 111-N can include resistors 115-1, . . . , 115-N (e.g., fault resistors) connected in series with the fan circuitry. A resistor can include a passive two-terminal electrical component that implements electrical resistance as a circuit element. A current through a resistor can be in direct proportion to a voltage across the resistor's terminals (represented by Ohm's law: I=V/R, where I=current, V=voltage, and R=resistance). Each resistor connected in series with each corresponding fan circuitry can be of equal resistance. For example, resistor 115-1 can include the same resistance as resistor 115-N. In this way, the voltage from each corresponding fan circuitry (e.g., 111-1 and 111-N) can be of equal value. Fan circuitry with resistors of equal resistance can have fans including a same circuit load. In this way, a voltage output of each fan including equal resistance and equal load can have an equal output to input into the operational amplifier and determine a number of fans in operation. However, examples may not be so limited. For example, a resistor can include a resistance equal to an amount that may correspond to the size, and therefore a circuit load, of a fan. A fan with a larger circuit load may include a larger resistance on the corresponding resistor. In this way, a differing size of fans can be accounted for. The number of fan circuits 111-1, . . . , 111-N can be connected in series 117 (e.g., in a "daisy chain" fashion) to a printed circuit assembly (PCA) 119. A PCA can include a printed circuit board (PCB) that is populated with electronic components. A PCB can mechanically support and electrically connect electronic components using conductive tracks, pads, and/or other features etched from copper sheets laminated onto a non-conductive substrate.

The PCA 119 can include an operational amplifier (OpAmp) 121. An OpAmp can be an electronic voltage amplifier with a differential input. An OpAmp can include a single-ended output. An OpAmp can produce an output potential (relative to circuit ground) that can be hundreds of thousands of times larger than a potential difference between the OpAmp's input terminals. An OpAmp's differential inputs can include a positive voltage input and a negative voltage input. The OpAmp can amplify the difference in voltage between the two inputs. The OpAmp 121 can be a closed loop amplifier, for example.

The OpAmp 121 can drive a resistor (e.g., a fault resistor 115-1) of a fan circuit (e.g., fan circuit 111-1 connected to a fan). A number of fan circuits 111-1, . . . , 111-N can be connected in parallel to the OpAmp 121. The number of fan circuits 111-1, . . . , 111-N can increase a current that contributes to a voltage input (e.g., an OpAmp Input 123) to the OpAmp 121. The OpAmp 121 can include a voltage reference (VREF) 125. A voltage reference can include an electronic device that can produce a fixed (e.g., constant) voltage irrespective of a loading on the device, power supply variations, temperature changes, and/or passage of time.

Using a closed loop amplifier and an accurate VRef 125 can provide for a system that has a high noise rejection ratio. The VREF 125 can be connected to a positive input of the OpAmp 121. The OpAmp 121 can provide a voltage output (VOutput) 127. The system 100 can be connected to a ground 129 (e.g., a reference point in an electrical circuit from which voltage can be measured and/or a common return path for electric current). A ground can limit a build-up of static electricity. The system 100 can be connected to a power supply (Vcc 131). A current flow 133 across resistor 147 of the system 100 can be determined by the following example formula:

$$I_{chain} = I_{bias} + n \times I_{fan}$$

A bias current (e.g., $I_{bias}$ 141) can be associated with a bias resistance (e.g., Rbias 143) 143. A bias current can include a predetermined current used to establish a stable operating condition. A bias resistor can maintain a stable amount of current so that a transistor is neither saturated or cut-off from the current in the system. The bias current and bias resistor can prevent distortion in the transistors. Each fan circuit (e.g., of fan circuits 111-1, . . . , 111-N) can include a fan resistor (e.g., fan resistor 115-1). The fan resistor 115-1 can be associated with a current (e.g., current $I_{fan1}$ 137-1) passing through the fan resistor 115-1. A first fan current (e.g., $I_{fan1}$ 137-1) can be equal to the current of a number of fans in series with an OpAmp 121 (e.g., $I_{fan}$). A second fan current (e.g., current $I_{fan2}$) can be equal to the current of a number of fans in series with an OpAmp 121 (e.g., $I_{fan}$). The arrow 145 indicates the flow of current out of the OpAmp 121.

The VOutput 127 can be associated with a Vref 125 and a number of fans multiplied by a voltage across each of the fans, for example. A fan circuit can have a fan voltage (e.g., Vfan 135). The following example formula can be used to determine the VOutput 137:

$$VOutput = Vref + n \times Vfan.$$

A determination of a number of fans in operation can be performed by using voltage reference 125, the OpAmp Input 123, and the VOutput 127. As the number of fans in operation increases (e.g., the number of resistors associated with a number of fans in operation in the system), the input resistance of the system drops. The input resistance mirrors the VRef 125 to the OpAmp Output 127. As the input resistance (e.g., OpAmp Input 123) decreases, a gain of the OpAmp 121 increases. As the gain of the OpAmp increases, the mirrored VRef 125 on the VOutput 127 increases. A higher gain indicates a greater number of resistors in the system, and therefore a greater number of fans in operation.

Due to the fault circuitry being maintained in each fan in the system 100, a fan can be added to the system 100 without additional reconfiguration of the system 100. In various examples, the system 100 can avoid using an individual fault wire for each fan. In this way, the number of routing wires can be decreased. In some instances, more than one fan can share a single fault signal. In one example, a number of modifications can be made to the system 100 to accommodate a differing number of fans on a fault signal. For example, using a negative supply and/or a greater voltage can increase a number of fans used on a fault signal. Tare example can include detection of a cable disconnection, a single fan disconnection, and/or a single wire disconnection.

Figure 2:
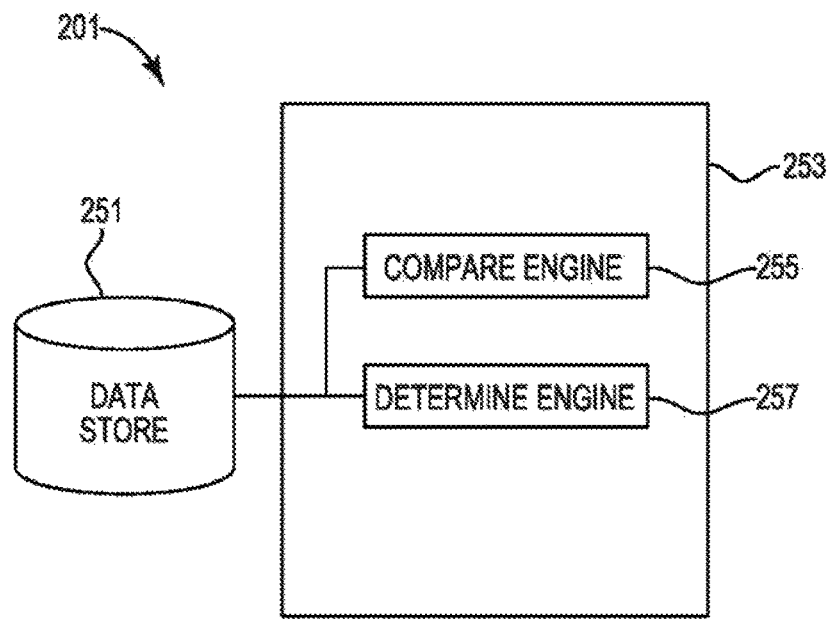
FIG. 2 illustrates an example of a system for fan operation detection according to the present disclosure.

FIG. 2 illustrates an example of a system 201 for fan operation detection according to the present disclosure. The system 201 can include a data store 251, a determining system 253, and/or a number of engines 255, 257. The determining system 253 can be in communication with the data store 251 via a communication link, and can include the number of engines (e.g., compare engine 255 and determine engine 257). The determining system 253 can include additional or fewer engines than illustrated to perform the various functions described herein.

The number of engines can include a combination of hardware and programming that is configured to perform a number of functions described herein (e.g., define a number of configurable rules based on a number of parameter values). The programming can include program instructions (e.g., software, firmware, etc.) stored in a memory resource (e.g., computer readable medium, machine readable medium, etc.) as well as hard-wired program (e.g., logic).

The compare engine 255 can include hardware and/or a combination of hardware and programming to compare a voltage reference to an output (e.g., voltage output) of an operational amplifier. The voltage output can indicate a number of fans operating in the system, for example. The voltage reference can be compared to the output of the OpAmp by an input resistance mirroring a voltage reference (e.g., VRef 125 in FIG. 1) to an output of the OpAmp (e.g., VOutput 127 in FIG. 1). A particular voltage output can correspond to a number of fans operating in the system. For example, a voltage read of 3 volts (V) can indicate 1 fan operating whereas a voltage read of 6V can indicate 3 fans operating in the system. For example, using the formula above (e.g., VOutput=Vref+n×Vfan), if a voltage reference is equal to 1.5V, each fan voltage (e.g., Vfan 135 in FIG. 1) is equal to 1.5V, and the voltage output (e.g., VOutput 127 of FIG. 1) is equal to 6V, the number of fans operating would be 3 (e.g., 6V=1.5V+n×(1.5V), where n would be solved to indicate 3 fans). However, examples are no so limited. The voltage reference and the voltage of each fan can vary depending on variables.

The determine engine 257 can include hardware and/or a combination of hardware and programming to determine whether a number of fans are in operation in the system based on the voltage output. For example, when the voltage output increases, a greater number of fans are determined to be in operation.

Figure 3:
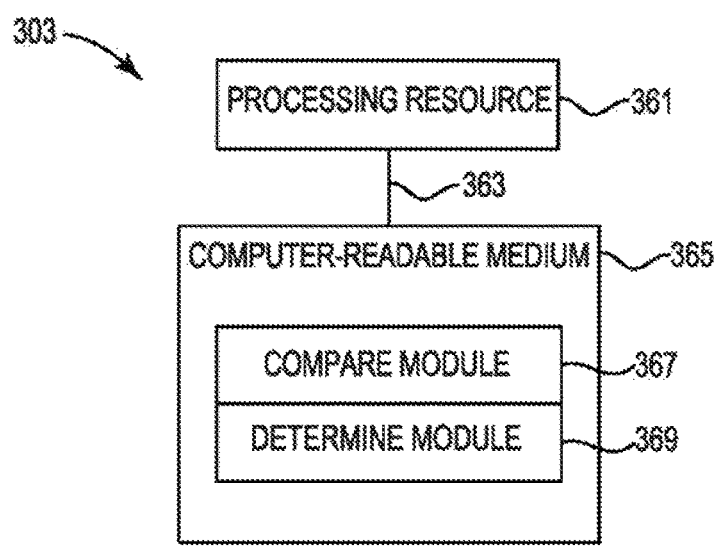
FIG. 3 illustrates an example of a system for fan operation detection according to the present disclosure.

FIG. 3 illustrates an example of a system for fan operation detection according to the present disclosure. The system can include, for instance, a computing device 303. The computing device 303 can be any combination of hardware and program instructions configured to share information. The hardware for example can include a processing resource 361 and/or a memory resource 365 (e.g., computer-readable medium (CRM), machine readable medium (MRM), database, etc.) A processing resource 361, as used herein, can include any number of processors capable of executing instructions stored by a memory resource 365. Processing resource 361 may be integrated in a single device or distributed across multiple devices. The program instructions (e.g., computer-readable instructions (CRI)) can include instructions stored on the memory resource 365 and executable by the processing resource 361 to implement a desired function (e.g., to define a number of rules based on a number of parameter values).

The memory resource 365 can be in communication with a processing resource 361. A memory resource 365, as used herein, can include any number of memory components capable of storing instructions that can be executed by processing resource 361. Such memory resource 365 can be a non-transitory CRM or MRM. Memory resource 365 may be integrated in a single device or distributed across multiple devices. Further, memory resource 365 may be fully or partially integrated in the same device as processing resource 361 or it may be separate but accessible to that device and processing resource 361. Thus, it is noted that the computing device 303 may be implemented on a participant device, on a server device, on a collection of server devices, and/or a combination of the user device and the server device.

The memory resource 365 can be in communication with the processing resource 361 via a communication link (e.g., a path) 363. The communication link 363 can be local or remote to a machine (e.g., a computing device) associated with the processing resource 361. Examples of a local communication link 363 can include an electronic bus internal to a machine (e.g., a computing device) where the memory resource 365 is one of volatile, non-volatile, fixed, and/or removable storage medium in communication with the processing resource 361 via the electronic bus.

A number of modules 367, 369 can include CRI that when executed by the processing resource 361 can perform a number of functions. The number of modules 367, 369 can be sub-modules of other modules. For example, the compare module 367 and the determine module 369 can be sub-modules and/or contained within the same computing device, to another example, the number of modules 367, 369 can comprise individual modules at separate and distinct locations CRM, etc.).

Each of the number of modules 367, 369 can include instructions that when executed by the processing resource 361 can function as a corresponding engine as described herein. For example, the compare module 367 can include instructions that when executed by the processing resource 361 can function as the compare engine 255. In another example, the determine module 369 can include instructions that when executed by the processing resource 361 can function as the determine engine 257.

Figure 4:
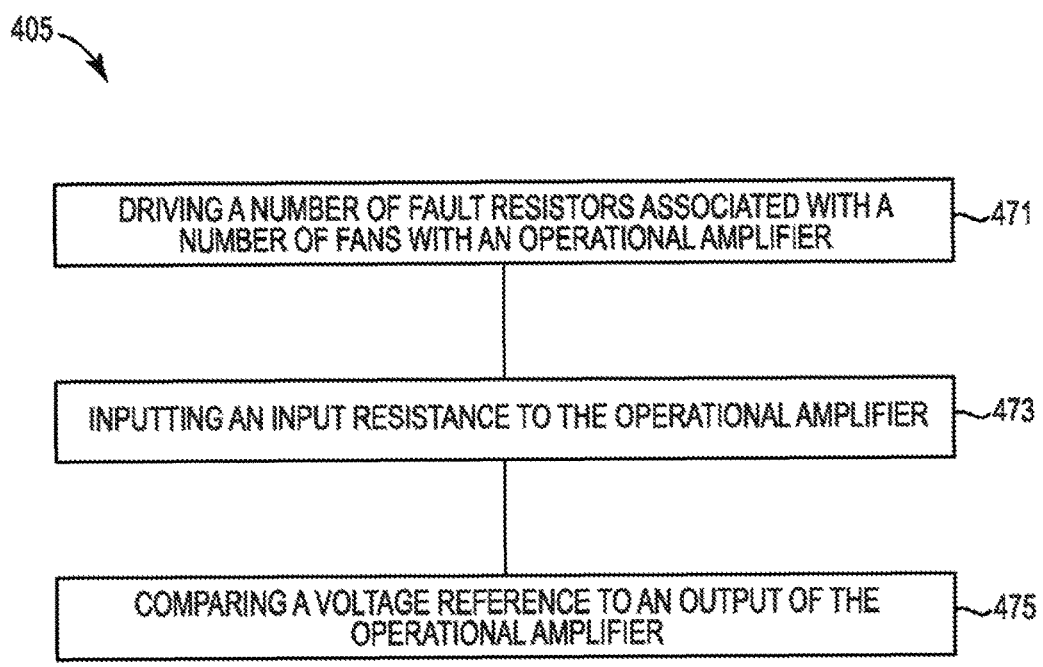
FIG. 4 illustrates a flow diagram of an example method for fan operation detection according to the present disclosure.

FIG. 4 illustrates a flow diagram of an example method for fan operation detection according to the present disclosure. The method 405 can include, at 471, driving a number of fault resistors associated with a number of fans with an operational amplifier. A fault resistor can be part of a fault signal circuit that is backward compatible with an existing fan. That is, the resistor is connected at the input rather than at the output. For example, the flow of current (e.g., 145 in FIG. 1) from an operational amplifier (e.g., OpAmp 121) drives the resistor (e.g., 115-1 in FIG. 1) of a fan (e.g., a fan associated with fan circuit 111-1).

At 473, the method 405 can include inputting an input resistance to the operational amplifier. The input resistance can include a resistance from a number of fans (e.g., fans associated with fan circuits 111-1, . . . , 11-N) that are connected to a number of resistors (e.g., resistors 115-1, . . . , 115-N). Each resistor connected in series with each corresponding fan circuitry can be of equal resistance. For example, a first resistor (e.g., resistor 115-1 in FIG. 1) can include the same resistance as a second resistor (e.g., resister 115-N in FIG. 1). In this way, the voltage from each corresponding fan circuitry (e.g., fan circuitry 111-1 and 111-N in FIG. 1) can be of equal value. Fan circuitry with resistors of equal resistance can have fans including a same circuit load. In this way, a voltage output of each fan including equal resistance and equal load can have an equal output to input into the operational amplifier and determine a number of fans in operation. However, examples may not be so limited. For example, a resistor can include a resistance equal to an amount that may correspond to the size, and therefore a circuit load, of a fan. A fan with a larger circuit load may include a larger resistance on the corresponding resistor. In this way, a differing size of fans can be accounted for.

At 475, the method 405 can include comparing a voltage reference to an output of an operational amplifier (OpAmp) (e.g., OpAmp 121 in FIG. 1). The voltage reference can be compared to the output of the OpAmp by an input resistance mirroring a voltage reference (e.g., VRef 125 in FIG. 1) to an output of the OpAmp (e.g., VOutput 127 in FIG. 1) A particular voltage output can correspond to a number of fans operating in the system. For example, a voltage read of 4 volts (V) can indicate 1 fan operating whereas a voltage read of 6V can indicate 3 fans operating in the system.

In the detailed description of the present disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be used and the process, electrical, and/or structural changes may be made without departing from the scope of the present disclosure.

In addition, the proportion and the relative scale of the elements provided in the figures are intended to illustrate the examples of the present disclosure, and should not be taken in a limiting sense. As used herein, the designators "N" and "P," particularly with respect to reference numerals in the drawings, indicate that a number of the particular feature so designated can be included with a number of examples of the present disclosure.

What is claimed:

1. A circuit for fan operation detection, comprising:
an operational amplifier having an output to drive a resistor of a fan, the resistor of the fan in series with a transistor of the fan, and the operational amplifier having an input connected to an input resistance that includes the resistor of the fan, the operational amplifier to detect an operation of the fan based on the input resistance.

2. The circuit of claim 1, wherein the input of the operational amplifier is connected to the resistor of the fan.

3. The circuit of claim 1, wherein the input resistance that is input to the operational amplifier is based on a plurality of resistors associated with a plurality of fans.

4. The circuit of claim 3, wherein a change in the input resistance changes a gain of the operational amplifier.

5. The circuit of claim 4, wherein the gain of the operational amplifier determines an output voltage of the output of the operational amplifier relative to a voltage reference connected to another input of the operational amplifier.

6. A method for fan operation detection, comprising:
driving fault resistors of a plurality of fans with an output of an operational amplifier;
inputting an input resistance based on the fault resistors to an input of the operational amplifier; and
comparing a voltage reference to an output voltage of the output of the operational amplifier.

7. The method of claim 6, comprising detecting a number of the plurality of fans that are operating based on the comparing.

8. The method of claim 7, wherein detecting the number of the plurality of fans that are operating comprises detecting a greater number of operating fans with a decrease in the input resistance and an increase in the output voltage of the operational amplifier.

9. The method of claim 6, comprising increasing a gain of the operational amplifier in response to a decrease in the input resistance.

10. The method of claim 9, comprising increasing the output voltage of the output of the operational amplifier relative to the voltage reference in response to increasing the gain of the operational amplifier.

11. A system comprising:
a plurality of fans coupled to an operational amplifier, wherein each of the plurality of fans comprises a circuit including a resistor in series with a transistor; and
an operational amplifier to:
drive the resistor of each of the plurality of fans; and
detect whether each of the plurality of fans is operating based on an input resistance to the amplifier operational using a voltage reference.

12. The system of claim 11, further comprising a processor to detect a number of the plurality of fans that are operating by comparing the voltage reference to an output of the operational amplifier.

13. The system of claim 11, wherein the plurality of fans are coupled to an input of the operational amplifier, wherein the input includes the input resistance that is based on the resistors of the plurality of fans.

14. The system of claim 11, wherein an output of the operational amplifier is to drive each of the resistors of the plurality of fans.

15. The system of claim 14, wherein the operational amplifier is to provide a flow of current that drives each of the resistors of the plurality of fans.

16. The system of claim 15, wherein the operational amplifier is to provide the flow of current to the resistors of the plurality of fans over a signal path connected to the resistors of the plurality of fans, and wherein the signal path is further connected to an input of the operational amplifier.

17. The system of claim 13, wherein an increase in a number of the plurality of fans being in operation reduces the input resistance to the operational amplifier, and the reduction of the input resistance to the operational amplifier increases a gain of the operational amplifier to cause an output voltage of the operational amplifier to be increased relative to the voltage reference.

18. The circuit of claim 3, wherein the output of the operational amplifier is to drive each of the resistors of the plurality of fans.

19. The circuit of claim 18, wherein the operational amplifier is to provide a flow of current to the resistors of the plurality of fans over a signal path connected to the resistors of the plurality of fans, and wherein the signal path is further connected to the input of the operational amplifier.

20. The circuit of claim 4, wherein the change in input resistance corresponds to a change in a number of the plurality of fans that are in operation.

21. The method of claim 6, wherein driving the fault resistors of the plurality of fans comprises driving a flow of current to the fault resistors of the plurality of fans over a signal path, the signal path connected to the input of the operational amplifier.

* * * * *

UNITED STATES PATENT AND TRADEMARK OFFICE
CERTIFICATE OF CORRECTION

PATENT NO. : 9,982,680 B2
APPLICATION NO. : 15/029934
DATED : May 29, 2018
INVENTOR(S) : Pedro Miguel Teixido Rovira et al.

It is certified that error appears in the above-identified patent and that said Letters Patent is hereby corrected as shown below:

On the Title Page

In Column 1, item (72), Inventors, Line 3, delete "Sant Cugart del Valles" and insert -- Sant Cugat del Valles --, therefor.

Signed and Sealed this
Twenty-fifth Day of September, 2018

Andrei Iancu
*Director of the United States Patent and Trademark Office*